United States Patent
Kida et al.

(10) Patent No.: US 6,874,675 B2
(45) Date of Patent: Apr. 5, 2005

(54) METHOD FOR MANUFACTURING PRINTED CIRCUIT BOARD

(75) Inventors: Tetsuo Kida, Amagasaki (JP); Samuel Kenneth Liem, 10726 Randy La., Cupertino, CA (US) 95014

(73) Assignees: Samuel Kenneth Liem, Cupertino, CA (US); MEC Company Ltd., Hyogo (JP)

( * ) Notice: Subject to any disclaimer, the term of this patent is extended or adjusted under 35 U.S.C. 154(b) by 88 days.

(21) Appl. No.: 10/616,194

(22) Filed: Jul. 9, 2003

(65) Prior Publication Data

US 2004/0079791 A1 Apr. 29, 2004

(30) Foreign Application Priority Data

Jul. 12, 2002 (JP) ........................................ 2002-204771

(51) Int. Cl.[7] ................................................. B23K 1/20
(52) U.S. Cl. ...................................... 228/206; 510/175
(58) Field of Search ................................. 228/201, 202, 228/205, 206, 179.1–180; 510/175; 134/2

(56) References Cited

U.S. PATENT DOCUMENTS

| | | | |
|---|---|---|---|
| 3,882,000 A | * 5/1975 | Schwartz et al. | ........... 205/157 |
| 4,968,397 A | * 11/1990 | Asher et al. | ................. 205/710 |
| 5,496,590 A | 3/1996 | Maki et al. | |
| 6,034,422 A | * 3/2000 | Horita et al. | ................ 257/677 |
| 6,268,619 B1 | * 7/2001 | Kosaki et al. | ............... 257/276 |
| 2004/0079791 A1 | * 4/2004 | Kida et al. | ................... 228/206 |
| 2004/0108224 A1 | * 6/2004 | Robertson et al. | ........... 205/789 |

FOREIGN PATENT DOCUMENTS

| | | | |
|---|---|---|---|
| JP | 5-186713 | | 7/1993 |
| JP | 2923596 | | 5/1999 |
| JP | 02003304051 A | * | 10/2003 |
| JP | 020004047827 A | * | 2/2004 |

* cited by examiner

Primary Examiner—Kiley S. Stoner
(74) Attorney, Agent, or Firm—Merchant & Gould P.C.

(57) ABSTRACT

A method for manufacturing a printed circuit board includes: washing a land that corresponds to the exposed portion of a copper circuit of a printed circuit board with acidic electrolytic water having a pH of not more than 5 to remove an oxide; treating the land with basic electrolytic water having a pH of not less than 9 to prevent oxidation; and soldering electronic components to the land. The portion to be soldered is treated with the electrolytic water beforehand, thereby improving soldering at low cost without any adverse effect on the environment.

12 Claims, 2 Drawing Sheets

METHOD FOR MANUFACTURING PRINTED CIRCUIT BOARD

BACKGROUND OF THE INVENTION

1. Field of the Invention

The present invention relates to a method for achieving a clean active copper surface with good solderability (wettability) by removing dirt and a copper oxide from a copper surface before electronic components are soldered to the exposed portion (land) of a copper circuit of a printed circuit board.

2. Description of the Related Art

The following methods have been employed to maintain the solderability of a land of a printed circuit board, i.e., to protect the land from oxidation or dirt.

(1) Hot Air Leveling

In this method, a land is coated with solder (tin-lead alloy). Specifically, a printed circuit board is immersed in a solder bath and then raised from the solder bath. Unwanted solder is removed by blowing hot air on the printed circuit board, so that a thin coating of solder is formed on the land.

(2) Rosin Preflux

In this method, a land is coated with a rosin-based resin. Specifically, the rosin-based resin dissolved in a solvent is applied to a printed circuit board by a roll coater and then dried, so that a coating of rosin-based resin is formed on the land (JP 5(1993)-186713 A).

(3) Benzimidazole Preflux

In this method, a land is coated with an imidazole-based compound such as benzimidazole. Specifically, a printed circuit board is immersed in an aqueous solution of benzimidazole compound and then dried, so that a coating of benzimidazole compound is formed on the land (Japanese Patent No. 2923596).

(4) Nickel/Gold Plating

In this method, a land is coated with two layers: a nickel-plated layer and a gold-plated layer. Specifically, the land is plated successively with nickel and gold by electroplating or electroless plating.

However, each of the above conventional methods has problems. For (1), it is difficult to achieve a uniform thickness of the solder coating. For (2), the use of an organic solvent involves dangerous and harmful effects. For (3), when reflow soldering is performed at high temperatures, the coating of benzimidazole compound is deformed due to its poor heat resistance, so that solderability is reduced. For (4), nickel corrosion called "black pad" is likely to occur, the number of processes is increased, and the material cost is high.

These problems of the conventional methods are attributed to the protective coating formed on the land.

SUMMARY OF THE INVENTION

Therefore, with the foregoing in mind, it is an object of the present invention to provide a method for imparting solderability to a land without forming a protective coating on the land.

A method for manufacturing a printed circuit board of the present invention includes: washing a land that corresponds to the exposed portion of a copper circuit of a printed circuit board with acidic electrolytic water having a pH of not more than 5 to remove an oxide; treating the land with basic electrolytic water having a pH of not less than 9 to prevent oxidation; and soldering electronic components to the land.

DESCRIPTION OF THE PREFERRED EMBODIMENTS

Figure 1:
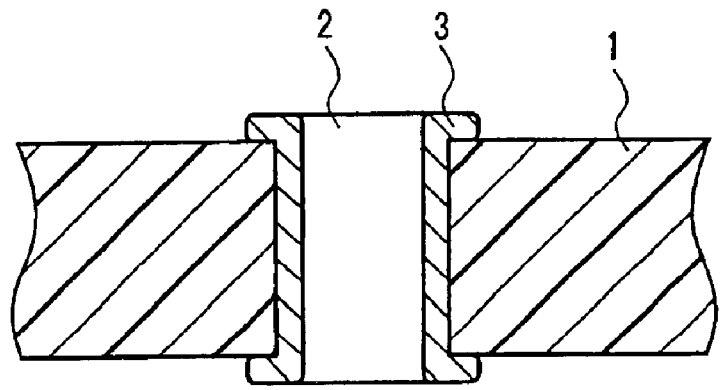
FIG. 1 is a cross-sectional view showing a copper-plated land that surrounds a through hole provided in a printed circuit board according to an example of the present invention.

A method of the present invention can make a copper surface clean before each soldering. Therefore, even if the soldering of electronic components on a printed wiring board is repeated two or more times, a problem derived from a protective coating such as degradation does not occur.

The method can be performed in a plant where electronic components are soldered to a printed wiring board because it does not use a treatment agent that is highly corrosive and has an adverse effect on the electronic components or a device for mounting the electronic components, e.g., a microetchant. Moreover, special drainage equipment is not necessary.

The electrolytic water used in the present invention can be obtained by electrolyzing water with current from a DC power supply. This electrolysis produces acidic water at the positive (plus) electrode and basic water at the negative (minus) electrode. The acidic water and the basic water are drawn separately. The amount of hydrogen ions ($H^+$) contained in the acidic water is relatively large compared with the basic water, and the amount of hydroxyl ions ($OH^-$) contained in the basic water is relatively large compared with the acidic water. The acidic water and the basic water thus produced are used for different purposes. Specifically, the land that corresponds to the exposed portion of a copper circuit of a printed circuit board is first washed by the acidic electrolytic water having a pH of not more than 5 to remove an oxide, and then treated with the basic electrolytic water having a pH of not less than 9 to prevent oxidation. At least these two processes can remove dirt and a copper oxide from the copper surface of the land, resulting in a clean active copper surface with good solderability (wettability). Electronic components are soldered to this active copper surface.

The basic electrolytic water has the effect of degreasing as well as preventing oxidation. Therefore, when fat or oil is attached to a pad, the pad may be treated with the basic electrolytic water before the acidic electrolytic water. That is, the pad may be treated with the basic electrolytic water, the acidic electrolytic water, and the basic electrolytic water in the order mentioned.

The pH of the acidic electrolytic water is preferably not more than 4, and further preferably not more than 3.

The pH of the basic electrolytic water is preferably not less than 10, and further preferably not less than 11.

When the acidic electrolytic water has a pH of more than 5, the effect of washing is reduced and solderability becomes poor. When the basic electrolytic water has a pH of less than 9, the effect of preventing oxidation is reduced and solderability becomes poor.

It is preferable that the application of the acidic electrolytic water or the basic electrolytic water to the land is performed by at least one selected from spraying and immersion.

The acidic electrolytic water and the basic electrolytic water that have been used in this method can be mixed to create neutral water, and thus drained easily. In other words, the used electrolytic water can be drained without using a neutralizing agent.

FIG. 1 is a cross-sectional view showing an example of a through hole surrounded by a land that is used in a method of the present invention. In FIG. 1, a through hole 2 is provided, e.g., in a glass epoxy substrate (an insulating substrate for a printed circuit board that includes glass fiber fabric impregnated with epoxy resin) 1, and a copper-plated land 3 is formed around the through hole 2. The surface of the land 3 is washed with acidic electrolytic water and treated with basic electrolytic water to prevent oxidation.

Figure 2:
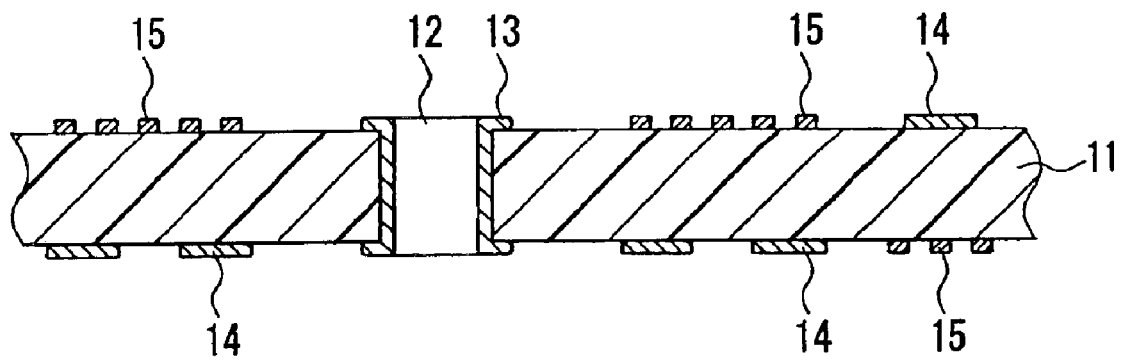
FIG. 2 is a cross-sectional view showing a printed circuit board with a land for surface mount according to another example of the present invention.

FIG. 2 is a cross-sectional view showing another example of a printed circuit board with a land for surface mount that is used in a method of the present invention. In FIG. 2, reference numeral 11 is a glass epoxy substrate, 12 is a through hole, 13 is a copper-plated land surrounding the through hole 12, 14 is a copper land for surface mount, and 15 is a wiring pattern on the substrate surface. The lands 13, 14 are washed with acidic electrolytic water and treated with basic electrolytic water to prevent oxidation.

In a method of the present invention, the acidic electrolytic water and the basic electrolytic water are used for different purposes. Specifically, the land that corresponds to the exposed portion of a copper circuit of a printed circuit board is first washed with the acidic electrolytic water having a pH of not more than 5 to remove an oxide, and then treated with the basic electrolytic water having a pH of not less than 9 to prevent oxidation. These processes can remove dirt and a copper oxide from the copper surface of the land, resulting in a clean active copper surface with good solderability (wettability). Subsequently, electronic components are soldered to this active copper surface. Thus, the method can improve soldering at low cost without any adverse effect on the environment.

EXAMPLES

Hereinafter, the present invention will be described in detail by way of examples.

Method for Producing Electrolytic Water

Figure 3:
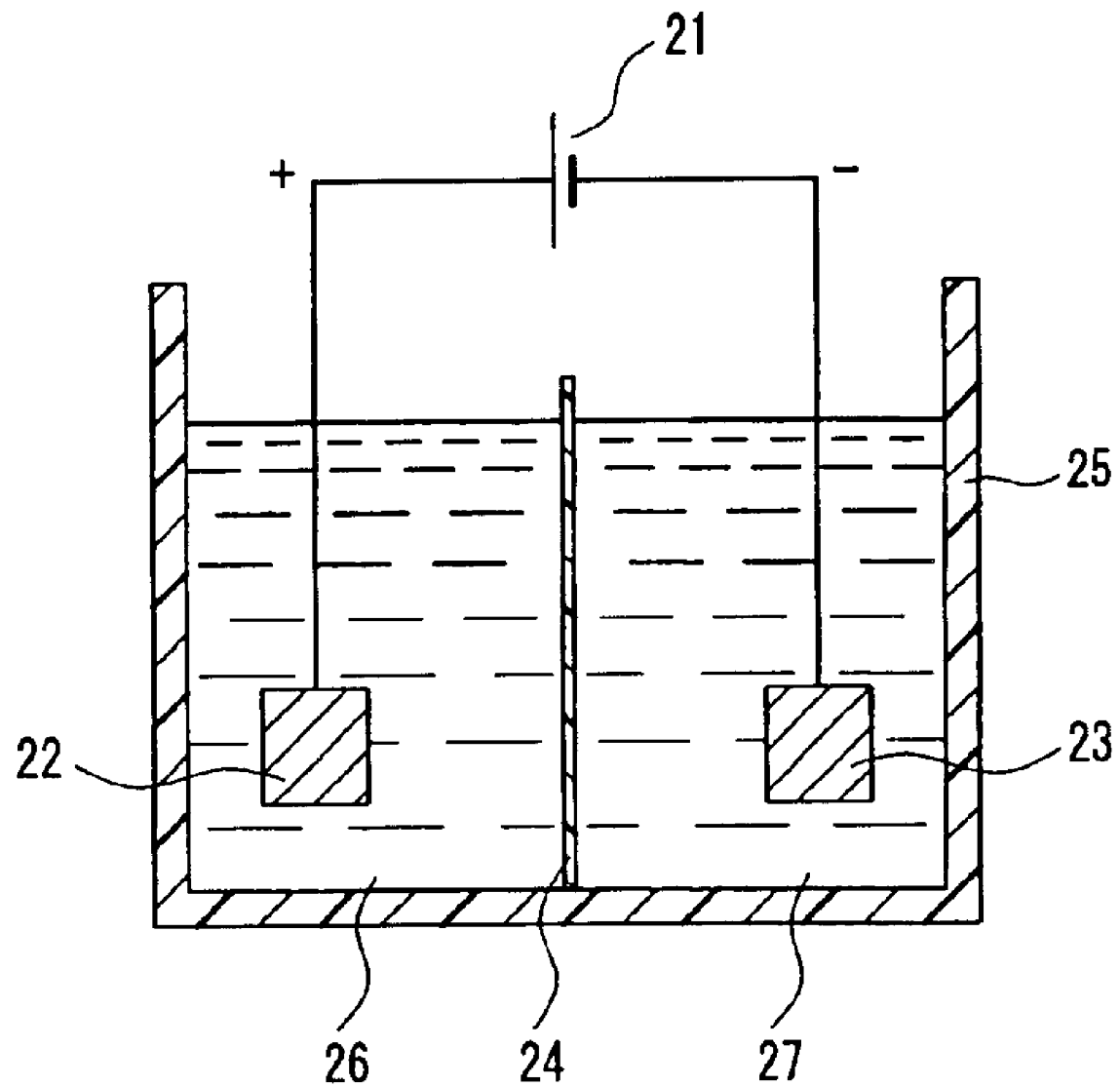
FIG. 3 is a cross-sectional view schematically showing a method for producing electrolytic water according to an example of the present invention.

FIG. 3 is a cross-sectional view schematically showing a method for producing electrolytic water according to an example of the present invention. A vessel 25 is filled with clean water. The water is electrolyzed by supplying a direct current from a power supply 21 to a plus electrode 22 and a minus electrode 23. An ion-permeable membrane 24 is arranged between the plus electrode 22 and the minus electrode 23. With this ion-permeable membrane 24, acidic water containing a relatively large amount of $H^+$ ions is generated in the region of the plus electrode 22, and basic water containing a relatively large amount of $OH^-$ ions is generated in the region of the minus electrode 23. The acidic water dissolves away a copper oxide (CuO) on the copper surface because of a relatively large amount of $H^+$ ions. This reduction can be expressed by

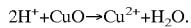

$$2H^+ + CuO \rightarrow Cu^{2+} + H_2O.$$

Subsequently, the copper surface is treated with the basic water, so that the copper is stabilized to prevent oxidation.

Example 1

Using an electrolyzer ("ESPAX 4000" manufactured by JIPCM), water was electrolyzed to produce acidic water having a pH of about 2.8 and basic water having a pH of about 11.5.

Solder Spread Test

A double-sided copper-clad laminate for a printed circuit board was used as a test substrate. The test substrate was degraded under the conditions shown in Table 1, then washed by spraying the acidic water at 30° C. for 20 seconds, and immersed in the basic water at 50° C. for 60 seconds.

The copper surface of the substrate thus treated was coated with a soldering flux ("SR-12" manufactured by Senju Metal Industry Co., Ltd.), on which a tin-lead eutectic solder ball having a diameter of 0.76 mm was placed. The substrate was heated in a reflow furnace at temperatures between 220° C. and 240° C. for 74 seconds so that the solder ball was melted. The area of spread of the solder ball was measured. Table 1 shows the results.

Solderability Test

A 2.2 mm-thick glass epoxy substrate (an insulating substrate for a printed circuit board that includes glass fiber fabric impregnated with epoxy resin) having 160 copper-plated through holes (FIG. 1) was used as a test substrate. Each of the through holes had an inner diameter of 1 mm and a land outer diameter of 1.2 mm. The test substrate was degraded under the conditions shown in Table 1, then washed by spraying the acidic water at 30° C. for 20 seconds, and immersed in the basic water at 50° C. for 60 seconds.

The substrate thus treated was coated with the soldering flux and floated in a tin-lead eutectic solder bath at 260° C. for 10 seconds so that the solder was filled into the through holes. Subsequently, the substrate was raised from the solder bath, and a proportion of the through holes filled with the solder was evaluated. Table 1 shows the results.

Comparative Example 1

Solder Spread Test

A 5 μm-thick nickel layer was formed on the copper surface of the test substrate used in Example 1 by electroless plating, and a 0.5 μm-thick gold layer was formed by displacement plating.

This test substrate was degraded under the conditions shown in Table 1. The substrate was coated with the soldering flux, on which a tin-lead eutectic solder ball having a diameter of 0.76 mm was placed. The substrate was heated in a reflow furnace at temperatures between 220° C. and 240° C. for 74 seconds so that the solder ball was melted. The area of spread of the solder ball was measured. Table 1 shows the results.

Solderability Test

A 5 μm-thick nickel layer was formed in the through holes of the test substrate used in Example 1 by electroless plating, and a 0.5 μm-thick gold layer was formed by displacement plating.

This test substrate was degraded under the conditions shown in Table 1. The substrate was coated with the soldering flux and floated in a tin-lead eutectic solder bath at 260° C. for 10 seconds. Subsequently, the substrate was raised from the solder bath, and a proportion of the through holes filled with the solder was evaluated. Table 1 shows the results.

Comparative Example 2

Solder Spread Test

A coating of imidazole-based compound ("CL-50" manufactured by MEC Co., Ltd.) was formed on the copper surface of the test substrate used in Example 1.

This test substrate was degraded under the conditions shown in Table 1. The substrate was coated with the soldering flux, on which a tin-lead eutectic solder ball having a diameter of 0.76 mm was placed. The substrate was heated in a reflow furnace at temperatures between 220° C. and 240° C. for 74 seconds so that the solder ball was melted. The area of spread of the solder ball was measured. Table 1 shows the results.

Solderability Test

A coating of benzimidazole-based compound was formed in the through holes of the test substrate used in Example 1.

This test substrate was degraded under the conditions shown in Table 1. The substrate was coated with the soldering flux and floated in a tin-lead eutectic solder bath at 260° C. for 10 seconds. Subsequently, the substrate was raised from the solder bath, and a proportion of the through holes filled with the solder was evaluated. Table 1 shows the results.

TABLE 1

| Sample No. | Substrate without degradation | | Three times of reflow* after leaving a substrate at 85° C. and 85RH for 24 hours | | Three times of reflow* after leaving a substrate at 85° C. and 85RH for 48 hours | |
|---|---|---|---|---|---|---|
| | Solder spread ($m^2$) | Solderability (%) | Solder spread ($m^2$) | Solderability (%) | Solder spread ($m^2$) | Solderability (%) |
| Example 1 | 4.31 | 100 | 4.16 | 99.4 | 4.42 | 99.2 |
| Comparative Example 1 | 13.86 | 100 | 8.26 | 100 | 11.78 | 99.6 |
| Comparative Example 2 | 5.83 | 99.4 | 2.77 | 97.8 | 1.43 | 58.6 |

*Reflow conditions: 220° C.–240° C. for 74 sec.

As described above, the solder spread in Example 1 is more improved than benzimidazole preflux (Comparative Example 2). The solderability in Example 1 is as good as nickel/gold plating (Comparative Example 1). Unlike Comparative Example 1, Example 1 of the present invention does not require nickel/gold plating and can reduce the material and working costs.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a printed circuit board comprising:

washing a land that corresponds to an exposed portion of a copper circuit of a printed circuit board with acidic electrolytic water having a pH of not more than 5 to remove an oxide;

treating the land with basic electrolytic water having a pH of not less than 9 to prevent oxidation; and soldering electronic components to the land.

2. The method according to claim 1, wherein the acidic electrolytic water has a pH of not more than 4.

3. The method according to claim 2, wherein the acidic electrolytic water has a pH of not more than 3.

4. The method according to claim 1, wherein the basic electrolytic water has a pH of not less than 10.

5. The method according to claim 4, wherein the basic electrolytic water has a pH of not less than 11.

6. The method according to claim 1, wherein application of the acidic electrolytic water or the basic electrolytic water to the land is performed by spraying.

7. The method according to claim 1, wherein application of the acidic electrolytic water or the basic electrolytic water to the land is performed by immersion.

8. The method according to claim 1, wherein washing with the acidic electrolytic water and oxidation prevention with the basic electrolytic water are performed successively as a pretreatment before soldering electronic components to the printed circuit board.

9. The method according to claim 1 wherein, the acidic electrolytic water that has been used for washing and the basic electrolytic water that has been used for oxidation prevention are mixed and drained.

10. The method according to claim 9, wherein the acidic electrolytic water and the basic electrolytic water are mixed to create neutral water, and the neutral water is drained.

11. The method according to claim 1, wherein the land of the printed circuit board is a copper-plated land that surrounds a through hole provided in a substrate.

12. The method according to claim 1, wherein the land of the printed circuit board is a land on which an electronic component or semiconductor is mounted.

* * * * *